(12) United States Patent
Kume

(10) Patent No.: US 7,592,724 B2
(45) Date of Patent: Sep. 22, 2009

(54) RECTIFIER FOR AUTOMOTIVE ALTERNATOR

(75) Inventor: Harumi Kume, Chita-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 12/285,939

(22) Filed: Oct. 16, 2008

(65) Prior Publication Data

US 2009/0102329 A1 Apr. 23, 2009

(30) Foreign Application Priority Data

Oct. 17, 2007 (JP) ............................. 2007-269827

(51) Int. Cl.
*H02K 19/36* (2006.01)
(52) U.S. Cl. ........................ 310/68 D; 310/71
(58) Field of Classification Search ............... 310/68 D, 310/71; 257/692, 796; 363/141, 145
See application file for complete search history.

(56) References Cited

U.S. PATENT DOCUMENTS 6,552,908 B2 * 4/2003 DeNardis ..................... 361/709
6,731,030 B2 * 5/2004 Keidar et al. ............... 310/68 D
6,867,517 B2 * 3/2005 Kumagai ................... 310/68 D
6,995,486 B2 * 2/2006 Bradfield et al. .......... 310/68 D
7,336,008 B2 * 2/2008 Horioka et al. ................ 310/71

FOREIGN PATENT DOCUMENTS

JP    2004282938 A  * 10/2004
JP    A-2004-282938    10/2004

* cited by examiner

*Primary Examiner*—Quyen Leung
*Assistant Examiner*—Leda Pham
(74) *Attorney, Agent, or Firm*—Oliff & Berridge, PLC

(57) ABSTRACT

In a rectifier for an automotive alternator, each of the rectifying elements includes a semiconductor chip and a lead electrode that connects the semiconductor chip to a corresponding one of terminals. The lead electrode has a joining portion joined to a second surface of the semiconductor chip and a lead body portion extending in a direction perpendicular to the second surface. The corresponding terminal has a joining portion that protrudes out of a terminal base and extends in the direction parallel to the second surface to be joined to the lead body portion. The joining portion of the corresponding terminal is formed of first and second terminal plates that are laminated in the direction perpendicular to the second surface. The first terminal plate is located farther from the semiconductor chip than the second terminal plate and has a larger coefficient of thermal expansion than the second terminal plate.

8 Claims, 3 Drawing Sheets

FRONT SIDE ← → REAR SIDE

RECTIFIER FOR AUTOMOTIVE ALTERNATOR

CROSS-REFERENCE TO RELATED APPLICATION

This application is based on and claims priority from Japanese Patent Application No. 2007-269827, filed on Oct. 17, 2007, the content of which is hereby incorporated by reference in its entirety into this application.

BACKGROUND OF THE INVENTION

1. Technical Field of the Invention

The present invention relates to a rectifier for an automotive alternator that is for use in a motor vehicle, such as a passenger car or a truck.

2. Description of the Related Art

A rectifier for an automotive alternator is generally designed to rectify three-phase AC power output from a three-phase stator winding of the alternator into DC power.

To be competitive in the market, it is required for the rectifier to be compact and light, have a high output and a low price, and be durable.

One of the factors that determine the durability of the rectifier is the fatigue life of solders that join, in each of the rectifying elements of the rectifier, a semiconductor chip to electrodes. Further, the fatigue life of the solders is influenced by loads, such as a load due to a difference in thermal expansion, a mechanical load induced during the assembly and installation of the rectifier. In particular, when a tensile load is applied to the solders in a direction perpendicular to the layers of the solder layers, the fatigue life of the solders will be considerably shortened.

To reduce such a tensile load, Japanese Patent First Publication No. 2004-282938 discloses a rectifier in which: a lead electrode of each of the rectifying elements is configured to include a stress-relieving portion; and a heat sink, which is disposed in contact with a mount electrode of each of the rectifying elements, is configured to have high rigidity.

In the above rectifier, when a large tensile load is applied to each of the rectifying elements, the stress-relieving portion of the lead electrode will be deformed, thereby absorbing the tensile load. However, when a small tensile load is applied to each of the rectifying elements, the stress-relieving portion of the lead electrode will not be deformed, allowing the tensile load to act on the solders. Consequently, as the small tensile load is continuously applied, the fatigue life of the solders will be shortened.

In addition, in the above rectifier, the stress-relieving portion of the lead electrode is formed into a spiral shape. However, forming such a complicated shape will increase the manufacturing cost of the rectifier.

Moreover, the lead electrode of each of the rectifying elements is generally soldered, at a high temperature, to a metal terminal so as to form a bridge circuit of the rectifier. However, when the temperature of the lead electrode drops from the high temperature to an ambient temperature, the lead electrode, which has joined in its expanded state to the metal terminal, will contract, producing a tensile load on the solders formed in the rectifying element. In particular, during operation of the rectifier, the lead electrode will be subject to a temperature lower than the high temperature for the soldering process, permitting the tensile load to constantly act on the solders.

SUMMARY OF THE INVENTION

The present invention has been made in view of the above-mentioned problems.

It is, therefore, a primary object of the present invention to provide a rectifier for an automotive alternator which has an improved structure by which it is possible to reduce tensile loads acting on the solders formed in the rectifying elements of the rectifier, thereby securing a long fatigue life of the solders.

According to the present invention, there is provided a rectifier for an automotive alternator. The rectifier includes: 1) a plurality of rectifying elements; 2) a heat sink that has the rectifying elements mounted thereon to dissipate heat generated by the rectifying elements during operation; 3) a plurality of terminals each of which is connected to a corresponding one of the rectifying elements; and 4) a terminal base that has the terminals built therein to support the terminals. Each of the rectifying elements includes a semiconductor chip and a lead electrode that connects the semiconductor chip to the corresponding one of the terminals. The semiconductor chip has a first surface fixed to the heat sink and a second surface opposite to the first surface. The lead electrode has a joining portion joined to the second surface of the semiconductor chip and a lead body portion extending in a direction perpendicular to the second surface of the semiconductor chip. The terminal base is disposed away from the lead body portion of the lead electrode in a direction parallel to the second surface of the semiconductor chip. The corresponding terminal has a joining portion that protrudes out of the terminal base and extends in the direction parallel to the second surface of the semiconductor chip to be joined to the lead body portion of the lead electrode. The joining portion of the corresponding terminal is formed of first and second terminal plates that are laminated together in the direction perpendicular to the second surface of the semiconductor chip. The first terminal plate is located farther from the semiconductor chip than the second terminal plate and has a larger coefficient of thermal expansion than the second terminal plate.

In the above rectifier according to the invention, at least one of the first and second terminal plates may be made of copper or a copper alloy.

Otherwise, at least one of the first and second terminal plates may be made of iron or an iron alloy.

In a preferred embodiment of the invention, the first terminal plate is made of copper and the second terminal plate is made of iron.

The joining portion of the lead electrode is soldered to the second surface of the semiconductor chip, forming a solder layer between the joining portion and the second surface.

Each of the rectifying elements further includes a mount electrode that is mounted on the heat sink. The first surface of the semiconductor chip is soldered to the mount electrode, forming a solder layer between the first surface and the mount electrode. Further, the mount electrode is soldered to the heat sink.

The lead electrode further includes a bent portion that is provided between the joining portion and the lead body portion to buffer a mechanical load applied to the lead electrode.

With the above configuration of the rectifier according to the invention, for each of the rectifying elements, when there is a change in the temperature, the center of the whole joining portion of the corresponding terminal is displaced toward the same direction as the center of the lead body portion of the lead electrode. Consequently, it is possible to minimize the tensile load which the joining portion of the corresponding terminal applies to the solder layers formed in the rectifying element via the lead electrode. As a result, it is possible to secure a long fatigue life of the solder layers.

BRIEF DESCRIPTION OF THE DRAWINGS

The present invention will be understood more fully from the detailed description given hereinafter and from the accompanying drawings of one preferred embodiment of the invention, which, however, should not be taken to limit the invention to the specific embodiment but are for the purpose of explanation and understanding only.

In the accompanying drawings.

DESCRIPTION OF PREFERRED EMBODIMENT

Figure 1:
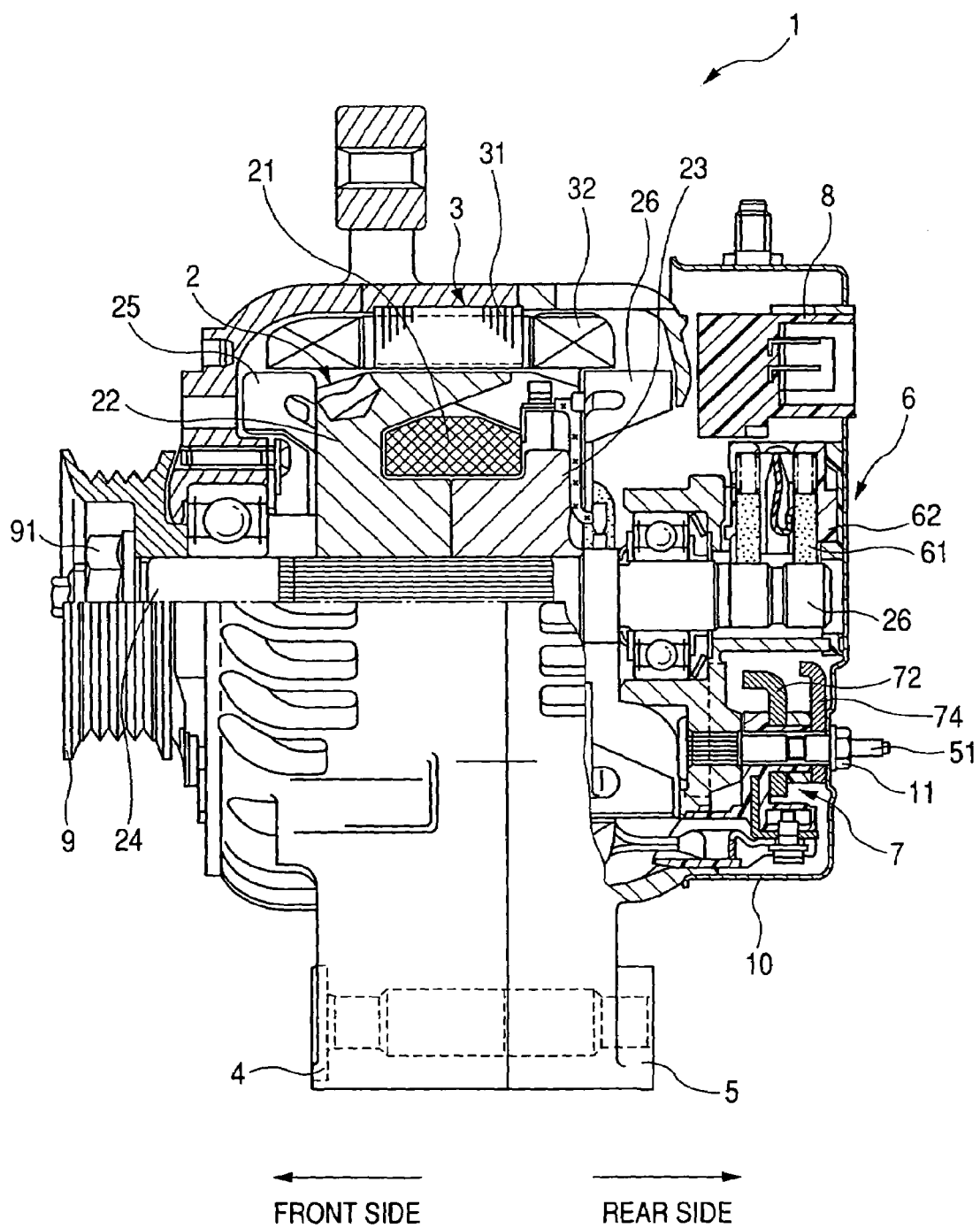
FIG. 1 is a partially cross-sectional view showing the overall configuration of an automotive alternator which includes a rectifier according to a preferred embodiment of the invention.

FIG. 1 shows the overall configuration of an automotive alternator 1 which includes a rectifier 7 according to a preferred embodiment of the invention. The automotive alternator 1 is designed for use in a motor vehicle, such as a passenger car or a truck.

As shown in FIG. 1, the alternator 1 includes, in addition to the rectifier 7, a rotor 2, a stator 3, a front frame 4, a rear fame 5, a brush assembly 6, a voltage regulator 8, a pulley 9, and a rear cover 10.

The rotor 2 includes a field winding 21, front and rear field cores 22 and 23, a rotary shaft 24, and front and rear cooling fans 25 and 26. The field winding 21 is made of an insulated copper wire, and is coaxially wound around the field cores 22 and 23 to have a cylindrical shape. The front and rear field cores 22 and 23 each include six claw portions, and are fit on the rotary shaft 24 with the claw portions of the front field core 22 interleaved with those of the rear field core 23. The front cooling fan 25 is fixed, for example by welding, to a front end face of the front field core 22. The front cooling fan 25 sucks cooling air from the front side in the axial direction and discharges the same in both the axial and radial directions. On the other hand, the rear cooling fan 26 is fixed, for example by welding, to a rear end face of the rear field core 23. The rear cooling fan 26 sucks cooling air from the rear side in the axial direction and discharges the same in the radial direction.

The stator 3 includes a stator core 31 and a three-phase stator winding 32 wound around the stator core 31.

The front frame 4 and the rear frame 5 together support and accommodate therein both the rotor 2 and the stator 3 so that the rotor 2 can rotate about the rotary shaft 24, and the stator 3 surrounds the rotor 2 with a given radial clearance therebetween.

The brush assembly 6 is provided to supply field current to the field winding 21 during rotation of the rotor 2. The brush assembly 6 includes a pair of brushes 61, which are respectively in sliding contacts with a pair of slip rings 26 provided on a rear end portion of the rotary shaft 24, and a brush holder 62 that holds therein the brushes 61.

The rectifier 7 is configured to rectify three-phase AC power output from the three-phase stator winding 32 of the stator 3 into DC power. The details about the configuration of the rectifier 7 will be described later.

The voltage regulator 8 is configured to regulate the output voltage of the alternator 1 by controlling the field current supplied to the field winding 21.

The pulley 9 is mounted on a front end portion of the rotary shaft 24 by means of a nut 91, so that torque generated by an engine (not shown) of the vehicle can be transmitted to the rotor 2 via the pulley 9, thereby driving the rotor 2.

The rear cover 10 covers, from the rear side of the alternator 1, all of the brush assembly 6, the rectifier 7, and the voltage regulator 8, thereby protecting them from foreign matter. The rear cover 10 is fixed to the rear frame 5 by fastening a nut 11 onto a bolt 51 extending from the rear cover 5.

After having described the overall configuration of the alternator 1, the detailed configuration of the rectifier 7 according to the present embodiment will be described hereinafter.

Figure 2:
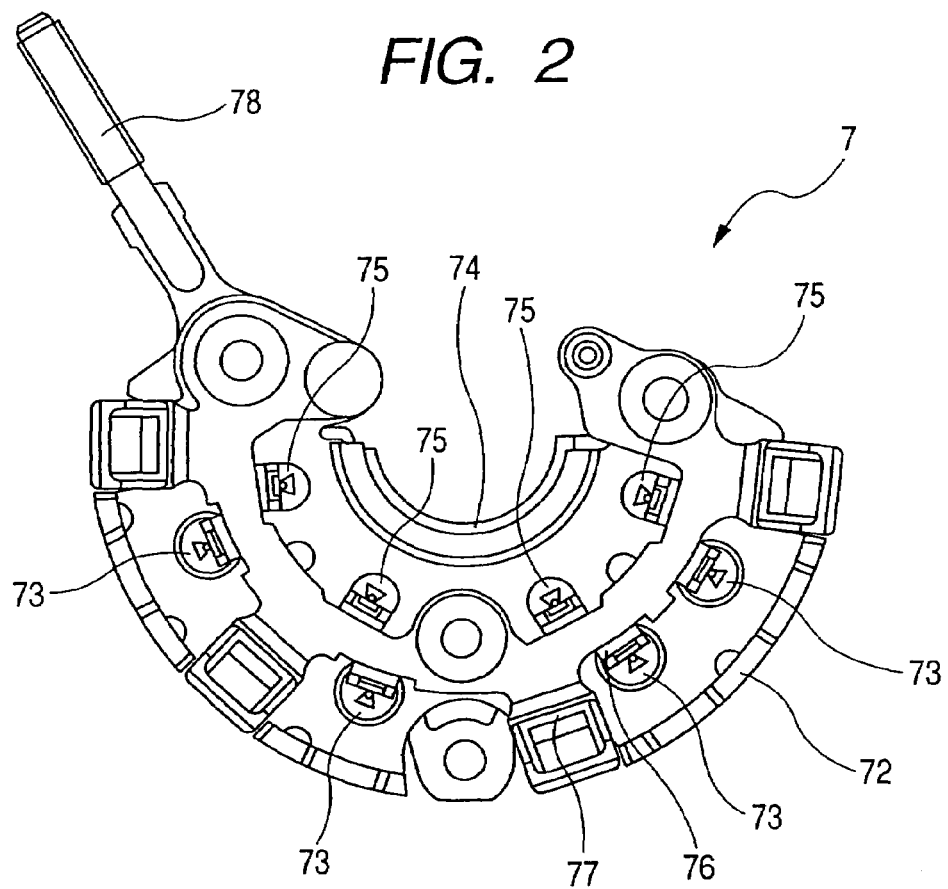
FIG. 2 is a plan view showing the configuration of the rectifier.

FIG. 2 shows the rectifier 7 from the rear frame 5-side. As seen from FIGS. 1 and 2, the rectifier 7 includes a positive-side heat sink 72, a plurality of positive-side rectifying elements 73, a negative-side heat sink 74, and a plurality of negative-side rectifying elements 75, a plurality of terminals 76, a terminal base 77, and an output terminal 78. The positive-side and negative-side heat sinks 72 and 74 are spaced away from each other in the axial direction of the rotary shaft 24 with an insulative member interposed therebetween. The positive-side rectifying elements 73 are mounted on the positive-side heat sink 72, whereas the negative-side rectifying elements 75 are mounted on the negative-side heat sink 74. The terminals 76 electrically connect the three-phase stator winding 32 of the stator 3 to the positive-side and negative-side rectifying elements 73 and 75. The terminal base 77 has the terminals 76 built therein. The output terminal 78 is provided on an end portion of the positive-side heat sink 72, through which the DC power obtained by the rectification of the three-phase AC power by the rectifier 7 is output. In addition, though the terminals 76 are shown in FIG. 2 as adjoining the positive-side and negative-side rectifying elements 73 and 75, the terminals 76 are actually apart from them as seen from FIG. 3.

Figure 3:
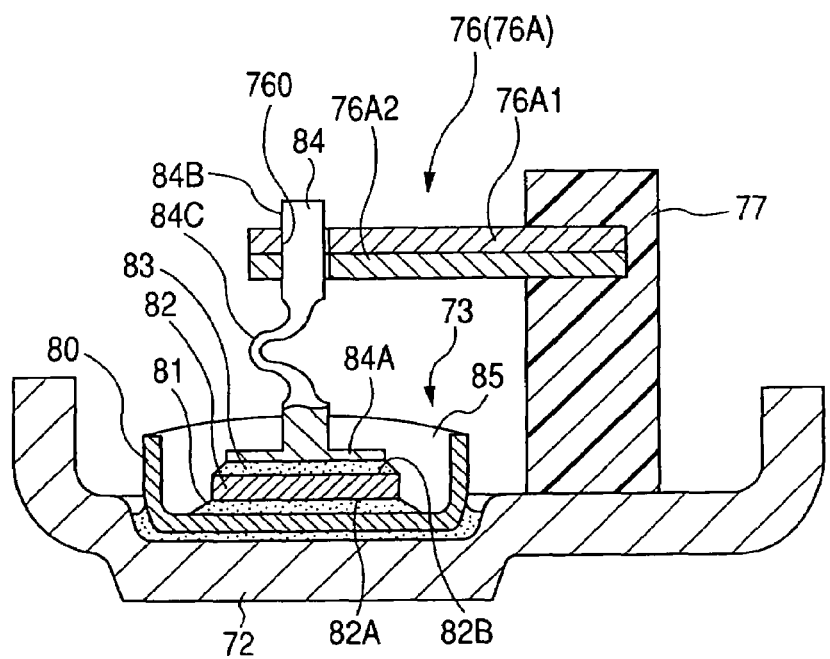
FIG. 3 is a cross-sectional view showing a positive-side rectifying element mounted in the rectifier.

FIG. 3 shows one of the positive-side rectifying elements 73, which is mounted on the positive-side heat sink 72 and connected to a corresponding one of the terminals 76 built in the terminal base 77. It should be noted that since all the positive-side and negative-side rectifying elements 73 and 75 have the same structure, only the positive-side rectifying element 73 shown in FIG. 3 will be described hereinbelow.

As seen from FIG. 3, the positive-side rectifying element 73 includes a mount electrode 80, a solder layer 81, a semiconductor chip 82 with an opposite pair of first and second major surfaces 82A and 82B, a solder layer 83, a lead electrode 84, and a resin seal 85.

The mount electrode 80 is fixed to the first major surface 82A of the semiconductor chip 82. More specifically, the mount electrode 80 is cup-shaped to have an end wall and a side wall, and serves as a supporting member to support the semiconductor chip 82. The semiconductor chip 82 is received in the mount electrode 82; the first major surface 82A of the semiconductor chip 82 is soldered to the inner surface of the end wall of the mount electrode 80, forming the solder layer 81 therebetween.

Moreover, the mount electrode 80 is made, for example, of copper. The outer surface of the end wall of the mount electrode 80 is soldered to a recessed surface of the positive-side heat sink 72, whereby the positive-side rectifying element 73 is mounted on the positive-side heat sink 72.

The lead electrode 84 is fixed to the second major surface 82B of the semiconductor chip 82. More specifically, the lead electrode 84 includes a joining portion 84A, a lead body portion 84B, and a buffer portion 84C between the joining portion 84A and the lead body portion 84B. The joining portion 84A has almost the same cross-sectional shape as the semiconductor chip 82; the joining portion 84A is soldered to the second major surface 82B of the semiconductor chip 82, forming the solder layer 83 therebetween. The lead body portion 84B extends in a direction perpendicular to the joining portion 84A (i.e., perpendicular to the second major surface 82B of the semiconductor chip 82). The buffer portion 84C is formed by slenderizing and bending part of the lead body portion 84B. In addition, both the semiconductor chip 82 and the joining portion 84A of the lead electrode 84 are shaped, for example, in a circular disc.

In the present embodiment, the terminal base 77 is disposed away from the lead body portion 84B of the lead electrode 84 of the positive-side rectifying element 73. The terminal 76 corresponding to the positive-side rectifying element 73 has a joining portion 76A that protrudes out of the terminal base 77 and extends in a direction perpendicular to the extending direction of the lead body portion 84B of the lead electrode 84. The joining portion 76A has a through-hole 760 formed in close vicinity to the distal end of the joining portion 76A.

The joining portion 76A of the corresponding terminal 76 is soldered to the lead body portion 84B of the lead electrode 84, with the lead body portion 84B inserted in the through-hole 760 formed in the joining portion 76A. In addition, it should be appreciated that the joining portion 76A may also be joined to the lead body portion 84B by other methods, such as welding, crimping, or adhesive bonding.

Moreover, in the present embodiment, the joining portion 76A of the corresponding terminal 76 is formed by laminating a first terminal plate 76A1 and a second terminal plate 76A2 in a direction perpendicular to the extending direction of the joining portion 76A. Further, the first and second terminal plates 76A1 and 76A2 have different coefficients of thermal expansion. More specifically, the first terminal plate 76A1 is located farther from the semiconductor chip 82 than the second terminal plate 76A2, and has a larger coefficient of thermal expansion than the second terminal plate 76A2.

With such a formation of the joking portion 76A, when there is a change in the temperature of the joining portion 76A, the center of the whole joining portion 76A is displaced in the lamination direction of the first and second terminal plates 76A1 and 76A2 (i.e., in the direction perpendicular to the second major surface 82B of the semiconductor chip 82) as a function of the difference in coefficient of thermal expansion between the first and second terminal plates 76A1 and 76A2.

In addition, at least one of the first and second terminal plates 76A1 and 76A2 may be made of copper or a copper alloy, thereby securing high electrical conductivity of the joining portion 76A and suppressing heat generated by the joining portion 76A. Otherwise, at least one of the first and second terminal plates 76A1 and 76A2 may be made of iron or an iron alloy, thereby securing high rigidity of the joining portion 76A and minimizing the manufacturing cost. In the present embodiment, the first terminal plate 76A1 is made of copper, and the second terminal plate 76A2 is made of iron, thereby achieving all the benefits described above. Moreover, it should be noted that at least one of the first and second terminal plates 76A1 and 76A2 may be made of nonmetal materials, such as a ceramic.

The above-described rectifier 7 according to the present embodiment has the following advantages.

In the rectifier 7, each of the positive-side and negative-side rectifying elements 73 and 75 includes the semiconductor chip 82 and the lead electrode 84 that connects the semiconductor chip 82 to the corresponding one of the terminals 76. The semiconductor chip 82 has the first major surface 82A fired to the corresponding one of the heat sinks 72 and 74 and the second major surface 82B opposite to the first major surface 82A. The lead electrode 84 has the joining portion 84A joined to the second major surface 82B of the semiconductor chip 82 and the lead body portion 84B extending in the direction perpendicular to the second major surface 82B of the semiconductor chip 82. The terminal base 77 is disposed away from the lead body portion 84B of the lead electrode 84 in the direction parallel to the second major surface 82B of the semiconductor chip 82. The corresponding terminal 76 has the joining portion 76A that protrudes out of the terminal base 77 and extends in the direction parallel to the second major surface 82B of the semiconductor chip 82 to be joined to the lead body portion 84B of the lead electrode 84. The joining portion 76A of the corresponding terminal 76 is formed of the first and second terminal plates 76A and 76B that are laminated together in the direction perpendicular to the second surface 82B of the semiconductor chip 82. The first terminal plate 76A is located farther from the semiconductor chip 82 than the second terminal plate 76B and has a larger coefficient of thermal expansion tan the second terminal plate 76B.

With the above configuration, for each of the positive-side and negative-side rectifying elements 73 and 75, when there is a change in the temperature, the center of the whole joining portion 76A of the corresponding terminal 76 is displaced toward the same direction as the center of the lead body portion 84B of the lead electrode 84. Consequently, it is possible to minimize the tensile load which the joining portion 76A applies to the solder layers 81 and 83 formed in the rectifying element via the lead electrode 84. As a result, it is possible to secure a long fatigue life of the solder layers 81 and 83.

In particular, when the lead body portion 84B of the lead electrode 84 is soldered at a high temperature to the joining portion 76A of the corresponding terminal 76, the lead body portion 84B expands so that the center of the lead body portion 84B is displaced in a direction away from the semiconductor chip 82. Meanwhile, the joining portion 76A of the corresponding terminal 76 also expands so that the center of the whole joining portion 76A is displaced in the direction away from the semiconductor chip 82 as a function of the difference in coefficient of thermal expansion between the first and second terminal plates 76A1 and 76A2.

Further, when the temperature of the lead body portion 84B drops from the high temperature to an ambient temperature, the lead body portion 84B contracts so that the center of the lead body portion 84B is displaced in a direction toward the semiconductor chip 82 to return to its initial position. Meanwhile, the joining portion 76A of the corresponding terminal 76 also contracts so that the center of the whole joining portion 76A is displaced in the direction toward the semiconductor chip 82 to return to its initial position.

Figure 4:
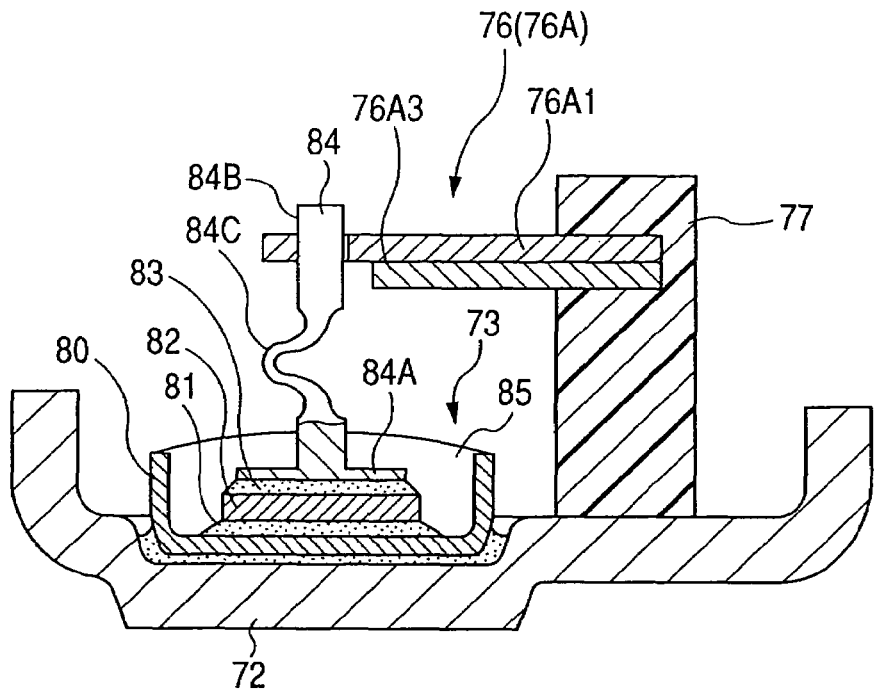
FIG. 4 is a cross-sectional view illustrating a modification of the rectifier.

FIG. 4 illustrates a modification of the rectifier 7. As shown, in this modification, the joining portion 76A of each of the terminals 76 is formed of the first terminal plate 76A1 and a second terminal plate 76A3 which is shortened at the distal end of the joining portion 76A. Consequently, only the first terminal plate 76A1 of the joining portion 76A is joined to the lead body portion 84B of the lead electrode 84.

Figure 5:
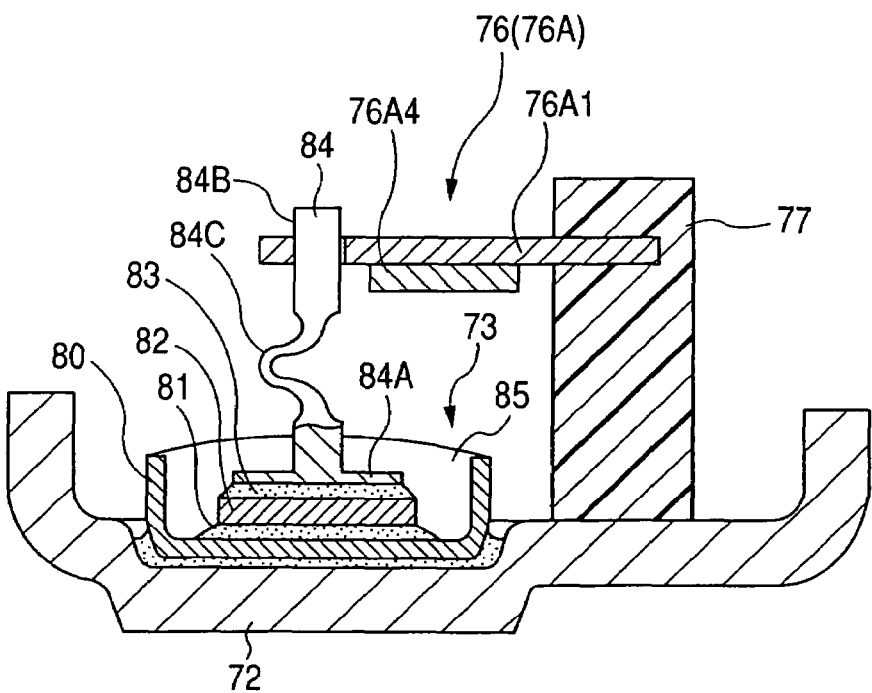
FIG. 5 is a cross-sectional view illustrating another modification of the rectifier.

FIG. 5 illustrates another modification of the rectifier 7. As shown, in this modification, the joining portion 76A of each of the terminals 76 is formed of the first terminal plate 76A1 and a second terminal plate 76A4 which is shortened at both the distal and proximal ends of the joining portion 76A. Consequently, only the first terminal plate 76A1 of the joining portion 76A protrudes from the terminal base 77 and is joined to the lead body portion 843 of the lead electrode 84.

It is possible to adjust the degree of displacement of the center of the whole joining portion 76A by adjusting the length of the second terminal plate as illustrated in FIGS. 3 to 5. Further, it is possible to adjust the degree of displacement of the center of the whole joining portion 76A to be equal to that of the center of the lead body portion 84B of the lead electrode 84. Consequently, it is possible to further effectively minimize the tensile load which the joining portion 76A applies to the solder layers 81 and 83 formed in the rectifying element via the lead electrode 84. As a result, it is possible to further reliably secure a long fatigue life of the solder layers 81 and 83.

In addition, it is also possible to adjust the degree of displacement of the center of the whole joining portion 76A to produce a compressive load on the solder layers 81 and 83. In this case, it is also possible to reliably secure a long fatigue life of the solder layers 81 and 83.

While the above particular embodiment and modifications of the invention have been shown and described, it will be understood by those skilled in the art that further modifications, changes, and improvements may be made without departing from the spirit of the invention.

For example, in the modifications illustrated in FIGS. 4 and 5, the second terminal plate of the joining portion 76A of the corresponding terminal 76 is shortened while the first terminal plate is kept unchanged.

However, it is also possible to shorten the first terminal plate of the joining portion 76A while keeping the second terminal plate unchanged.

Moreover, in the previous embodiment, each of the positive-side and negative-side rectifying elements 73 and 75 is soldered to a recessed surface of a corresponding one of the heat sinks 72 and 74.

However, each of the positive-side and negative-side rectifying elements 73 and 75 may also be press-fitted into a hole formed in the corresponding one of the heat sinks 72 and 74.

In the previous embodiment, the joining portion 76A of each of the terminals 76 is formed of the first and second terminal plates.

However, the joining portion 76A of each of the terminals 76 may further include one or more terminal plates in addition to the first and second terminal plates.

What is claimed is:

1. A rectifier for an automotive alternator, the rectifier comprising:
    a plurality of rectifying elements;
    a heat sink that has the rectifying elements mounted thereon to dissipate heat generated by the rectifying elements during operation;
    a plurality of terminals each of which is connected to a corresponding one of the rectifying elements; and
    a terminal base that has the terminals built therein to support the terminals,
    wherein
    each of the rectifying elements includes a semiconductor chip and a lead electrode that connects the semiconductor chip to the corresponding one of the terminals,
    the semiconductor chip has a first surface fixed to the heat sink and a second surface opposite to the first surface,
    the lead electrode has a joining portion joined to the second surface of the semiconductor chip and a lead body portion extending in a direction perpendicular to the second surface of the semiconductor chip,
    the terminal base is disposed away from the lead body portion of the lead electrode in a direction parallel to the second surface of the semiconductor chip,
    the corresponding terminal has a joining portion that protrudes out of the terminal base and extends in the direction parallel to the second surface of the semiconductor chip to be joined to the lead body portion of the lead electrode,
    the joining portion of the corresponding terminal is formed of first and second terminal plates that are laminated together in the direction perpendicular to the second surface of the semiconductor chip, and
    the first terminal plate is located farther from the semiconductor chip than the second terminal plate and has a larger coefficient of thermal expansion than the second terminal plate.

2. The rectifier as set forth in claim 1, wherein at least one of the first and second terminal plates is made of copper or a copper alloy.

3. The rectifier as set forth in claim 1, wherein at least one of the first and second terminal plates is made of iron or an iron alloy.

4. The rectifier as set forth in claim 1, wherein the first terminal plate is made of copper and the second terminal plate is made of iron.

5. The rectifier as set forth in claim 1, wherein the joining portion of the lead electrode is soldered to the second surface of the semiconductor chip, forming a solder layer between the joining portion and the second surface.

6. The rectifier as set forth in claim 1, wherein each of the rectifying elements further includes a mount electrode that is mounted on the heat sink, and
    the first surface of the semiconductor chip is soldered to the mount electrode, forming a solder layer between the first surface and the mount electrode.

7. The rectifier as set forth in claim 6, wherein the mount electrode is soldered to the heat sink.

8. The rectifier as set forth in claim 1, wherein the lead electrode further includes a bent portion that is provided between the joining portion and the lead body portion to buffer a mechanical load applied to the lead electrode.

* * * * *